US 6,526,118 B2

(12) United States Patent
Komatsuda et al.

(10) Patent No.: US 6,526,118 B2
(45) Date of Patent: *Feb. 25, 2003

(54) PROJECTION EXPOSURE APPARATUS AND METHOD, AND ILLUMINATION OPTICAL SYSTEM THEREOF

(75) Inventors: Hideki Komatsuda, Kawasaki (JP); Takashi Mori, Fujisawa (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/391,171

(22) Filed: Sep. 7, 1999

(65) Prior Publication Data

US 2002/0054660 A1 May 9, 2002

(30) Foreign Application Priority Data

Sep. 8, 1998 (JP) .......................................... 10-269056

(51) Int. Cl.[7] ................................................. G21K 5/00
(52) U.S. Cl. ....................................................... 378/34
(58) Field of Search ............................................. 378/34

(56) References Cited

U.S. PATENT DOCUMENTS

| | | |
|---|---|---|
| 4,294,538 A | 10/1981 | Ban |
| 4,362,384 A | 12/1982 | Engelbrecht et al. |
| 5,194,893 A | 3/1993 | Nishi |
| 5,315,629 A | 5/1994 | Jewell et al. |
| 5,339,346 A | 8/1994 | White |
| 5,393,623 A | 2/1995 | Kamon |
| 5,439,781 A | 8/1995 | MacDowell et al. |

(List continued on next page.)

FOREIGN PATENT DOCUMENTS

| | | | |
|---|---|---|---|
| EP | 0 633 506 A1 | 1/1995 | ............. G03F/7/20 |
| JP | 08005796 | 1/1996 | ............. G21K/1/06 |
| JP | 08160200 | 6/1996 | ............. G21K/5/02 |
| JP | 10284408 | 10/1998 | ......... H01L/21/027 |

OTHER PUBLICATIONS

William C. Sweatt, "High–Efficiency Condenser Design for Illuminating a Ring Field," *OSA Proceedings on Soft X–Ray Projection Lithography*, vol. 18 (1993).

Stulen et al., "Developing a Soft X–Ray Projection Lithography Tool," *AT&T Technical Journal* 70 No. 6 (Nov./Dec. 1991).

*Primary Examiner*—Craig E. Church
(74) *Attorney, Agent, or Firm*—Chapman and Cutler (57) ABSTRACT

In a projection exposure apparatus used in lithography process for transferring a predetermined pattern formed on a reflection type mask onto a photosensitive substrate, the reflection mask and the substrate are moved relative to each other by a scanning driver, and the illumination optical system located between a radiation light source and the reflection mask includes a field stop located near a position conjugate with the reflection mask. In another embodiment a scanning driver changes the positional relationship between the reflection mask and the projection optical system, or/and between the substrate and the projection optical system. In another embodiment an image of the field stop is formed on the reflection mask by a relay optical system, preferably a catoptric system, forming the predetermined pattern. The projection optical system located between the reflection mask and the substrate directs the light reflected from the mask to the substrate, and illuminance distribution of the light on the exposure area of the substrate is adjustable by changing the position of reflection optical elements located along the optical path of the radiation light in the illumination optical system.

35 Claims, 5 Drawing Sheets

U.S. PATENT DOCUMENTS

| | | |
|---|---|---|
| 5,473,410 A | 12/1995 | Nishi |
| 5,524,039 A | 6/1996 | Kamon |
| 5,591,958 A | 1/1997 | Nishi et al. |
| 5,640,284 A | 6/1997 | Tanitsu et al. |
| 5,669,708 A | 9/1997 | Mashima et al. |
| 5,677,754 A | 10/1997 | Makinouchi |
| 5,677,939 A | 10/1997 | Oshino |
| 5,737,137 A | 4/1998 | Cohen et al. |
| 5,854,671 A | 12/1998 | Nishi |
| 5,896,438 A * | 4/1999 | Miyake et al. ................ 378/34 |
| 6,268,906 B1 | 7/2001 | Suzuki |

* cited by examiner

PROJECTION EXPOSURE APPARATUS AND METHOD, AND ILLUMINATION OPTICAL SYSTEM THEREOF

BACKGROUND OF THE INVENTION

1. Field of the Invention

The invention relates to a projection exposure apparatus and method used in the lithography process of projecting a form, such as a mask or reticle, onto a wafer for the purpose of manufacturing devices, e.g., integrated circuits, imaging devices, liquid crystal displays, or thin film magnetic recording heads. More specifically, the present invention relates to a projection exposure apparatus and method of using soft x-rays called EUVL (Extreme Ultra Violet Lithography). The present invention also relates to an illumination optical system and method suitable for the projection exposure apparatus. Finally, the present invention relates to a method of manufacturing said devices by means of said apparatus.

2. Description of Related Art

A projection exposure apparatus for projecting a form, such as a mask or reticle, onto a wafer by means of soft x-rays (EUV radiation) is disclosed in documents such as Sweatt, William C. High-Efficiency Condenser Design for Illuminating a Ring Field. OSA Proceedings on Soft X-Ray Projection Lithography, Vol. 18 (1993) and U.S. Pat. No. 5,315,629.

In this projection exposure apparatus, a reflection type mask is used as a form, and the exposure is performed while the form is moved relative to the projection optics. In other words, a scanning exposure method is utilized for projecting the whole pattern of the form onto the shot area on the wafer (work). The exposure is performed while an exposure area, which is an image of a portion of the form, is being scanned onto the work.

In the projection exposure apparatus using soft x-rays according to the prior art described above, the exposure area should be limited in order that only the specific pattern on the mask is projected.

In performing the scanning exposure, in order to make the cumulative exposure equal at every point in the shot area, it is necessary to make the slit width along the scanning direction within the exposure area substantially equal at any point along the direction perpendicular to the scanning direction.

In performing the scanning exposure, there are two methods for limiting the exposure area: either a slit is placed near the reflection mask, or a slit is placed near the work. In the former method, the slit must be moved relative to the reflection mask while performing the exposure. In the latter method, on the other hand, the slit must be moved relative to the work while performing the exposure. Therefore, there must be a space between the slit and the reflection mask or the work, in order to avoid direct contact between the slit and the reflection mask or the work.

Figure 5A:
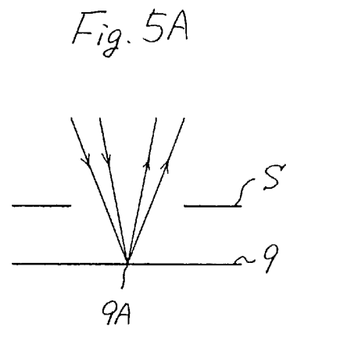
FIGS. 5A through 5C represent the plan views showing the vignetting of the light flux caused by a field stop.
Figure 5B:
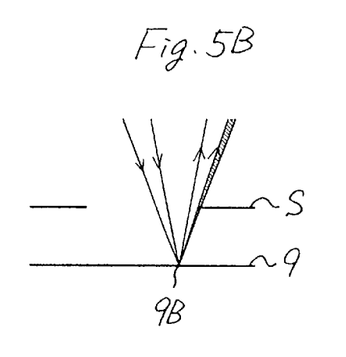
Figure 5C:
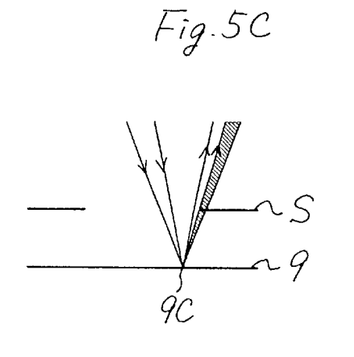
Figure 5D:
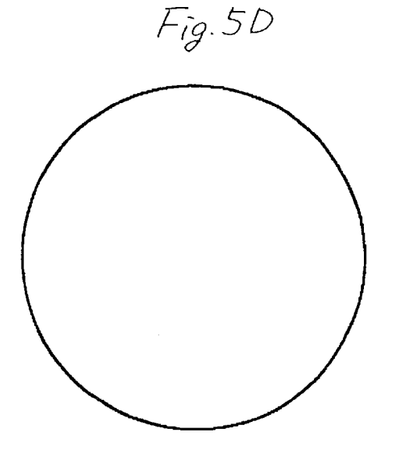
FIGS. 5D through 5F represent the schematic diagrams showing the shape of the aperture produced by the vignetting of the light flux.
Figure 5E:
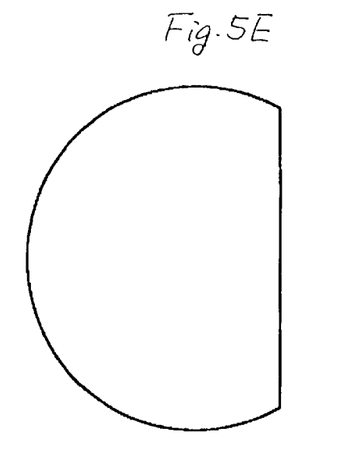
Figure 5F:
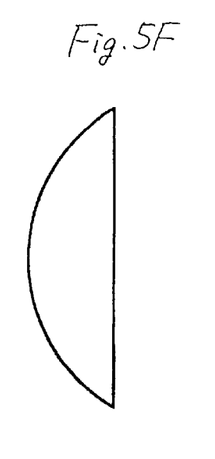

Instances where the distance between the slit and the reflection mask or between the slit and the work are determined are described with reference to FIG. 5. FIGS. 5A through 5C show the relation between the slit S and the light flux arriving at the reflection mask 9. FIG. 5A shows a case where the light flux arrives at the center 9A of the exposure area. FIGS. 5B and 5C show cases where the light flux arrives at the corners 9B and 9C of the exposure area. Since the light flux arriving at the center of the exposure area does not produce vignetting, as seen from FIG. 5A, the shape of the aperture of the projection optical system becomes a circle as shown in FIG. 5D. Because the light flux arriving at 9B and 9C, on the other hand, produce vignetting, as seen by the hatched portion in FIGS. 5B and 5C, the shape of the aperture of the projection optical system shows a portion of the circle cut out, as seen in FIGS. 5E and 5F.

The resolving power of an optical system is generally represented by the following equation:

$$LW = k \cdot \lambda / NA$$

wherein the reference symbol LW represents the line width at the resolution limit, k represents a constant, $\lambda$ represents the wavelength, and NA represents the numerical aperture of the projection optical system. As seen from the above equation, the line width at the resolution limit is inversely proportional to the numerical aperture of the projection optical system. It is necessary that the resolving power be constant regardless of the position in the wafer plane or the direction of the pattern (vertical, horizontal or inclined).

If the slit S is placed near the reflection mask or the work, vignetting is produced in a portion of the light flux at the exposure area near the edge of the slit S. Since resolving power varies according to the direction of the pattern, it is not possible to obtain an accurate image. In the scanning exposure method, because the scanning exposure is performed also in areas where an inaccurate image is produced, the difficulty is that the image in the entire illumination area becomes less accurate.

If a change in the magnitude or shape of the exposure area or illumination area is desired, it is necessary for the slit itself to be movable. In this case, it is impossible to project an accurate image because of problems such as those described below. In order to prevent interference between the movable mechanism of the slit S and the reflection mask or the work, the distance between the slit S and the reflection mask or the work increases. Also, dust is produced by the movable mechanism of the slit S.

SUMMARY OF THE INVENTION

Accordingly, it is an object of the present invention to provide an accurate image even in cases where a reflection mask is used.

In order to achieve the object described above, a projection exposure apparatus according to an embodiment of the present invention comprises:

a light source providing radiation light;

an illumination optical system directing said radiation light to a reflection mask on which a predetermined pattern is formed;

a projection optical system directing said radiation light reflected by said reflection mask to an exposed substrate (work) for forming an image of a predetermined pattern on said exposed substrate; and a scanning driver relatively moving at least one of said reflection mask and said exposed substrate;

wherein said illumination optical system includes a field stop located near a position substantially conjugate with said reflection mask.

In order to achieve the object described above, a projection exposure apparatus according to another embodiment of the present invention is used for directing radiation light to a reflection mask on which a predetermined pattern is formed, and for projecting an image of said predetermined pattern onto a work by said radiation light reflected by said reflection mask, the projection exposure apparatus comprising:

a radiation light source;

an illumination optical system located between said radiation light source and said reflection mask, and directing said radiation light from said radiation light source to said reflection mask;

a projection optical system located between said reflection mask and said work, directing said radiation light reflected by said reflection mask to an exposed substrate, and forming the image of said predetermined pattern on said exposed substrate;

a scanning driver relatively changing the positional relationship between at least one of said reflection mask and said work, and said projection optical system; and a field stop located near a position conjugate with said reflection mask.

In order to achieve the object described above, an illumination apparatus according to another embodiment of the present invention is designed for use in a photolithography apparatus forming an image of a reflection mask on which a predetermined pattern is formed on a work, the illumination apparatus comprising:

a radiation light source; and an illumination optical system located between said radiation light source and said reflection mask, to direct said radiation light provided from said radiation light source to a predetermined illumination area on said reflection mask;

wherein said illumination optical system includes a field stop and a relay optical system forming an image of said field stop on said reflection mask as said predetermined illumination area.

In the embodiments described above, it is desirable for said relay optical system to be a catoptric system. In any embodiment described above, it is desirable for said radiation source to provide radiation light having a wavelength shorter than 50 nm.

In order to achieve the object described above, a projection exposure apparatus according to another embodiment of the present invention is designed for directing radiation light to a reflection mask on which a predetermined pattern is formed, and for projecting an image of said predetermined pattern on a work by said radiation light reflected by said reflection mask, the projection exposure apparatus comprising:

a radiation light source;

an illumination optical system located between said radiation light source and said reflection mask, for directing said radiation light provided from said radiation light source to said reflection mask;

a projection optical system located between said reflection mask and said work, directing said radiation light reflected by said reflection mask to an exposed substrate, and forming the image of said predetermined pattern on said exposed substrate;

wherein a position of at least one of the reflection optical elements located along the optical path of said radiation light in said illumination optical system is adjustable in order to adjust illuminance distribution of said radiation light on said exposure area.

In order to achieve the above described object, a method according to another embodiment of the present invention is a method of projecting and exposing a predetermined pattern formed on a reflection mask onto a work comprising the steps of:

providing a radiation light source;

illuminating a reflection mask on which a predetermined pattern is formed with said radiation light source by means of an illumination optical system;

projecting said pattern of said reflection mask onto a work based on reflected light from said reflection mask; and moving at least one of said reflection mask and said work relative to the other; wherein said illuminating step further comprises a step of forming an image of a field stop placed in said illumination optical system on said reflection mask.

In order to achieve the object described above, a projection exposure method according to another embodiment of the present invention is a method of projecting and exposing a predetermined pattern formed on a reflection mask onto a work comprising the steps of:

providing a radiation light source;

illuminating a reflection mask on which a predetermined pattern is formed with said radiation light by means of an illumination optical system;

projecting said pattern of said reflection mask onto a work based on reflected light from said reflection mask;

adjusting the position of at least one optical element located along the optical path where said radiation light is directed to said field stop in order to change the illuminance distribution in said exposure area on said work.

In the present invention, radiation light means electromagnetic waves including the deep ultraviolet, vacuum ultraviolet, soft x-ray, and hard x-ray areas.

BRIEF DESCRIPTION OF DRAWINGS

FIG. 3 represents the schematic diagram showing the mechanism of the field stop according to the modification of the present invention.

FIG. 4 represents the schematic diagram showing the movement of the field stop shown in FIG. 3.

FIG. 5 represents the schematic diagram exhibiting the problems in a projection exposure apparatus according to the prior art.

DETAILED DESCRIPTION OF PREFERRED EMBODIMENTS

The present invention will be described in detail below in accordance with the embodiment shown in FIG. 1. A laser source 100 generates laser light having a wavelength from the infrared to the visible light regions. A YAG laser, for example, may be used for the laser source 100. Laser light generated by the laser source 100 is converged by a collecting optics 101 focusing at a focal point 3. An object (EUV light-generating object) dripped from an object source 2 is illuminated with high illuminance laser light at the focal point 3. The central portion of the object thereby becomes plasma, and a soft x-ray is then generated from this portion. The following objects may be used for the EUV light-generating object (target): water drops, ice particles, drops of any water solution, Xe gas, Kr gas, or tape or wire shaped Cu or Ta (Tantalum).

For the wavelength of the soft x-ray, it is desirable to use a wavelength smaller than 50 nm, e.g. a radiation light source of 13 nm. Since the transmittance of soft x-rays relative to air is rather low, the whole apparatus is placed in a vacuum chamber 1.

The soft x-ray generated at focal point 3 is directed to a field stop (aperture) 7, having an opening of a predetermined area, by the optics 4, 5, and 6, which is a combination of plane mirrors and concave mirrors. In this embodiment, a reflection-increasing film is applied to the reflecting surface of the optics 4, 5, and 6, increasing the reflectance in the soft x-ray region. For the reflection-increasing film, such combinations of materials as Mo and Si or Mo and Be, which are alternately applied in a number of layers, may be used.

For the field stop 7, materials blocking soft x-rays are suitable.

In this embodiment, although a laser plasma x-ray source is used for the light source, an undulator equipped with a synchrotron orbital radiation (SOR) may be used for the light source. In this embodiment, although a wavelength of 13 nm generated from a SOR is used, wavelengths such as 26 nm or 39 nm generated from a SOR as well as 1 nm of hard x-rays may also be used.

The radiation light passing through the opening of the field stop 7 is then directed to a reflection mask 9 through a relay optical system 8 consisting of reflection optics. A pattern consisting of a portion reflecting, and a portion not reflecting, soft x-rays is formed on the surface of the reflection mask 9. The optical systems 4, 5, 6, and 8 compose an illumination optical system illuminating the reflection mask 9.

The field stop 7 is optically conjugate with the reflection mask 9 with respect to the relay optical system 8, and an image of the field stop 7 is projected on the reflection mask 9. The image of the opening of the field stop 7 coincides with the illuminated area on the reflection mask 9.

The radiation light selectively reflected by the reflection mask 9 is directed to a wafer 11 as an exposed substrate (work), placed on a substrate stage ST2 by a projection optical system 10 having a predetermined reduction magnification. The pattern in the illuminated area on the reflection mask 9 is then projected on the wafer 11. As shown in FIG. 2, an exposure area IE is formed on the wafer 11. The exposure area IE has a shape similar to the illuminated area on the reflection mask 9 which is also similar to the opening of the field stop 7. The image of the pattern in the illuminated area on the reflection mask 9 is formed in the exposure area IE.

Returning to FIG. 1, a mask stage ST1 and the substrate stage ST2 are connected with drivers MT1 and MT2 respectively. These drivers MT1 and MT2 are connected with a main controller MCU.

Figure 1:
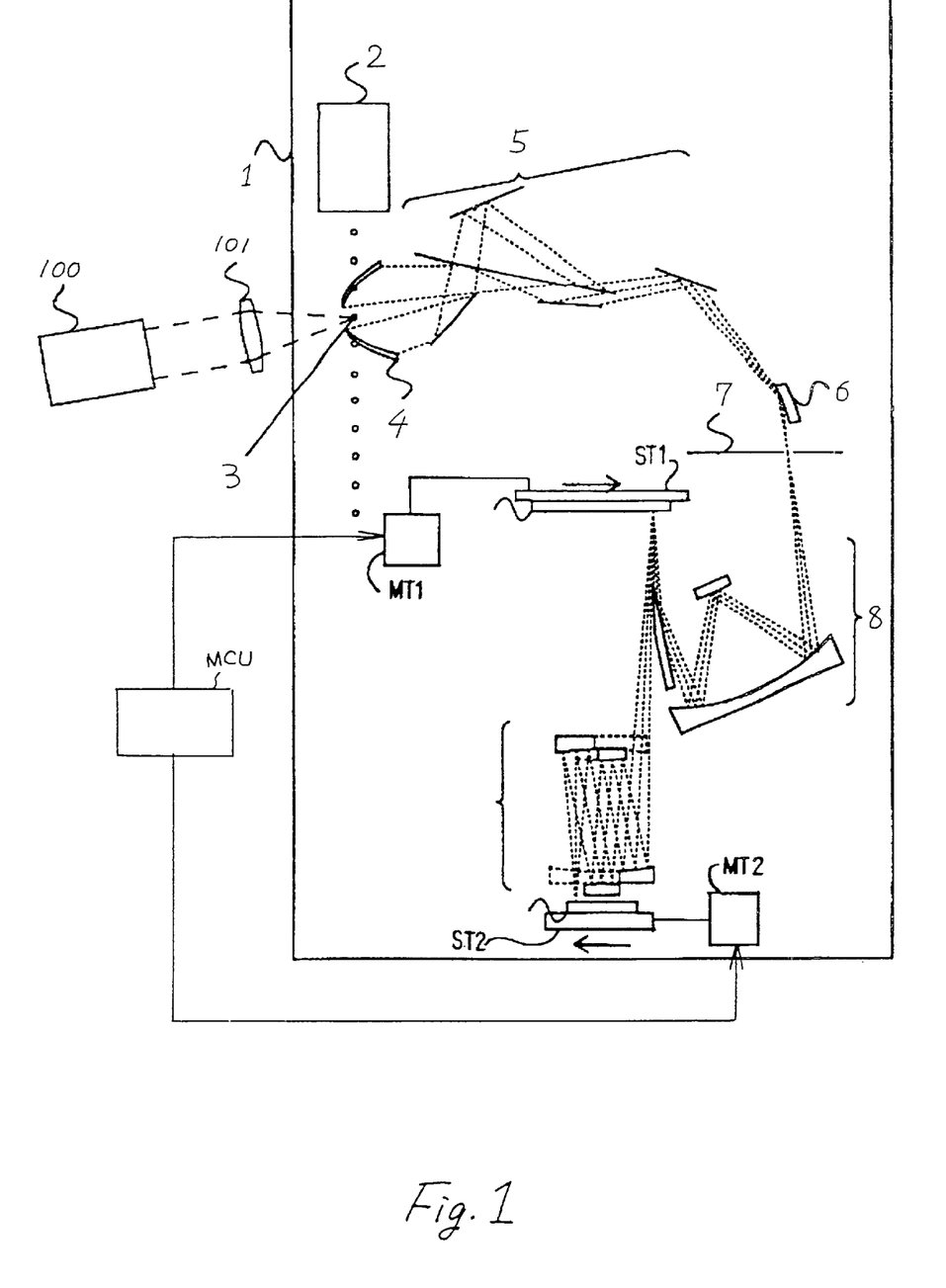
FIG. 1 represents the schematic diagram showing the optical design of the projection exposure apparatus according to the present invention.
Figure 2:
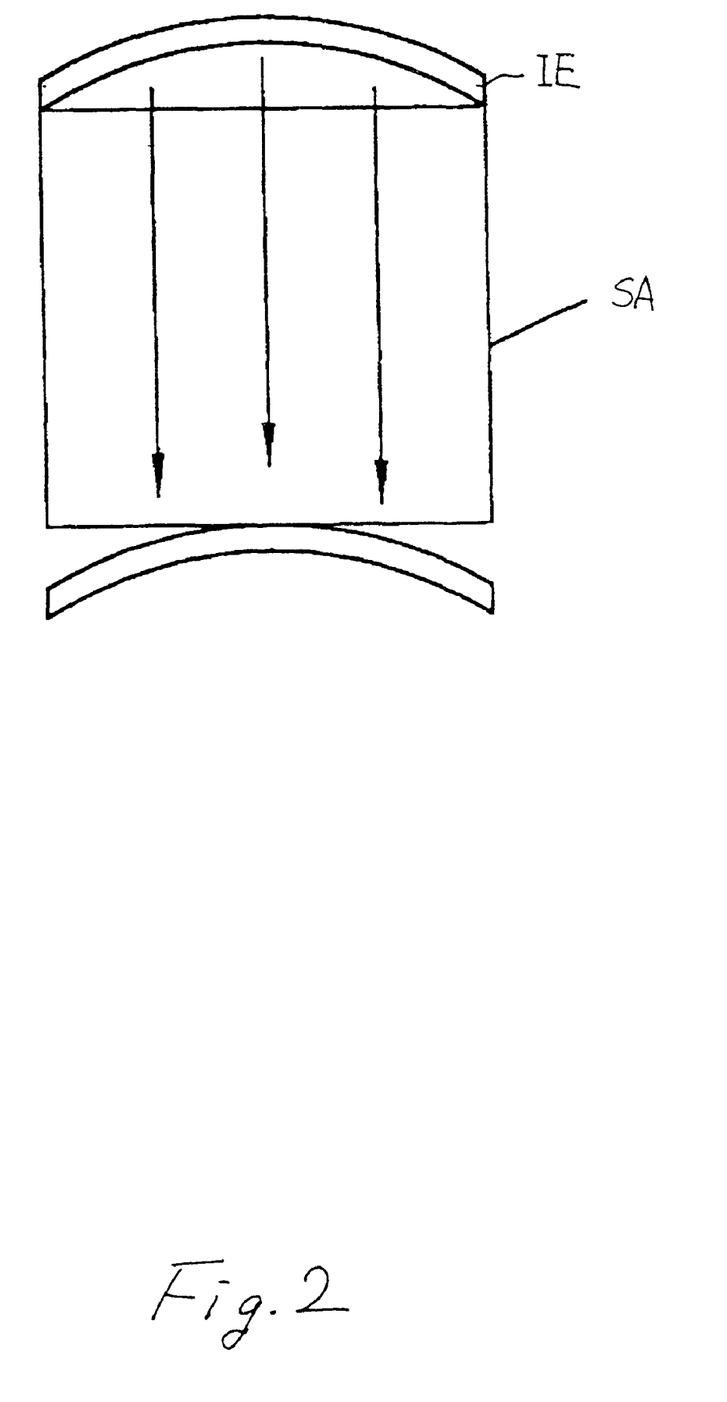
FIG. 2 represents the schematic diagram showing the state of the scanning exposure.

While performing the exposure, the reflection mask 9 and 20 wafer (exposed substrate) 11 are moved relative to the projection optical system 10 in the direction indicated by the arrow shown in FIG. 1 by means of the drivers MT1 and MT2. In this embodiment, since there is a vacuum inside the chamber 1, it is desirable to use a magnetic levitation type linear actuator or a differential exhaust type pneumatic bearing in combination with an actuator such as a linear motor for these drivers MT1 and MT2. It is also desirable to use an electrostatic chuck as a chucking mechanism for the mask stage ST1 and the substrate stage ST2.

As shown in FIG. 2, the exposure area IE sweeps along the scanning direction, indicated by the arrow in the figure, on the wafer 11 as a work (exposed substrate). The exposure area on the wafer 11 consequently corresponds with the locus of the sweep of the exposure area IE, and the exposure area corresponds with the single shot area SA on the wafer 11.

In this embodiment, the field stop 7 is optically conjugate with the reflection mask 9 with respect to the relay optical system 8. The field stop 7 is optically conjugate with the wafer 11 with respect to the relay optical system 8, the reflection mask 9 and the projection optical system 10. Since it is optically equivalent to placing the field stop 7 on the reflection mask 9, the illuminated area (or the exposure area) may be limited. In this configuration, because no field stop 7 exists in the vicinity of the reflection mask 9, there is no vignetting produced by the field stop 7 at any point in the exposure area, and good resolution may be obtained in the whole exposure area.

If an intermediate image of the reflection mask 9 is formed in the projection optical system 10, the field stop 7 may be placed at the intermediate image position.

It is desirable to compose the projection optical system 10 with a reflection optical system having less than six reflection surfaces.

Although only one field stop 7 is used in the embodiment shown in FIG. 1, the field stop is not limited to one. It is possible to combine plural elements such as blades limiting the width in the direction perpendicular to the sweeping direction together with blades limiting the width in the sweeping direction.

Figure 3A:
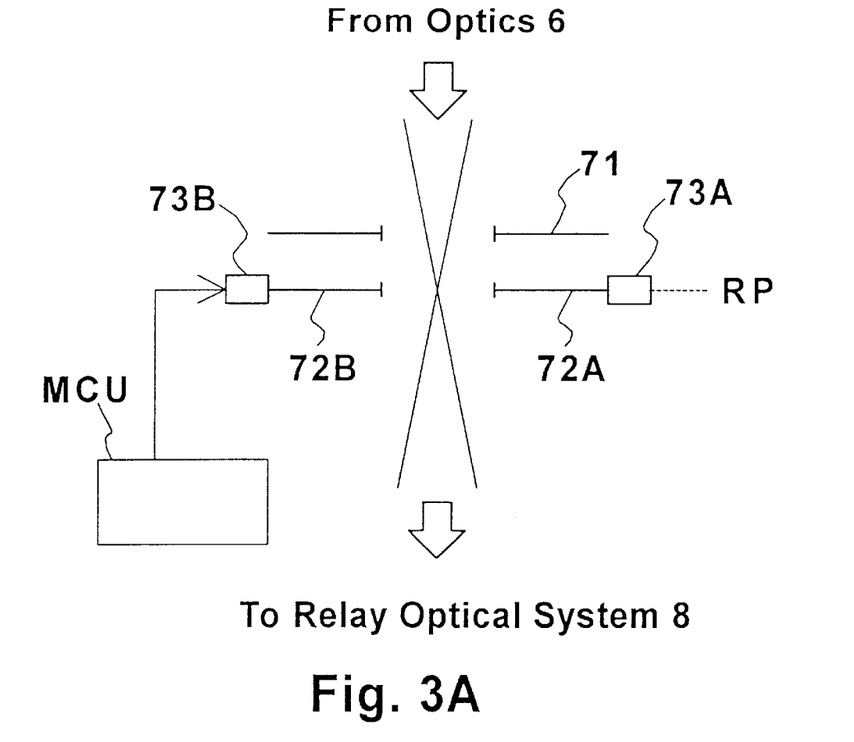
FIG. 3A shows its sectional view.
Figure 3B:
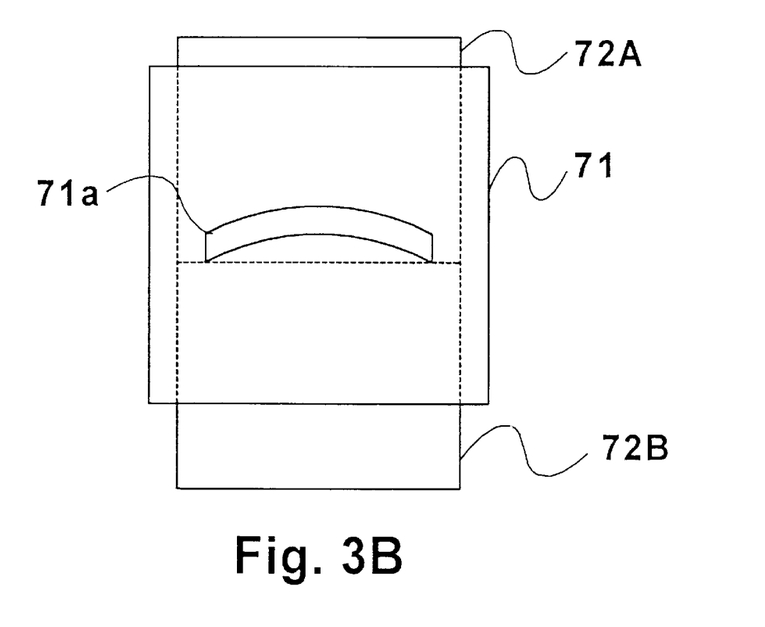
FIG. 3B shows its plan view.

A modified example of the field stop is described with reference to FIG. 3. FIG. 3A represents a sectional view showing a field stop 70 consisting of a fixed field stop 71 and variable field stops 72A and 72B. FIG. 3B represents a plan view showing the relative position of the fixed field stop 71 and the variable field stops 72A and 72B.

In FIGS. 3A and 3B, the field stop has the fixed field stop 71 and the movable field stop 72A and 72B, wherein the field stop has an arc shaped opening 71A and the movable field stop has two blades 72A, 72B defining the width in the sweeping direction of the illumination area (or exposure area) on the reflection mask 9 (or on the wafer 11). The fixed field stop 71 shown in FIGS. 3A, 3B is equivalent to the field stop 7 in FIG. 1.

Each blade 72A, 72B defining the width in the sweeping direction of the movable field stop is movable such that each blade 72A, 72B has a driving unit 73A, 73B driving each blade in the sweeping direction independently. Here, the sweeping direction corresponds to the direction in which the projected image of the reflection mask 9 (or the wafer 11) on the field stop 7 by the relay optical system 8 (or by the relay optical system 8 in combination with the projection optical system 10) is swept. In the modified embodiment shown in FIG. 3, the radiation light illuminates the predetermined area defined by the movable field stop 72A, 72B, which is within the scope of the arc shaped illumination area on the reflection mask 9 (or the wafer 11) defined by the fixed field stop 71.

Figure 4A:
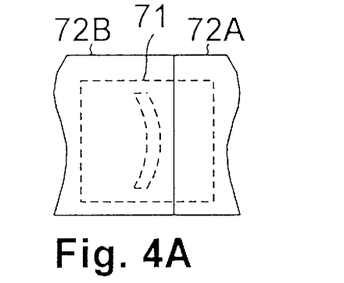
FIGS. 4A through 4E represent the plan view showing the relative position between the fixed field stop and the movable field stop.
Figure 4B:
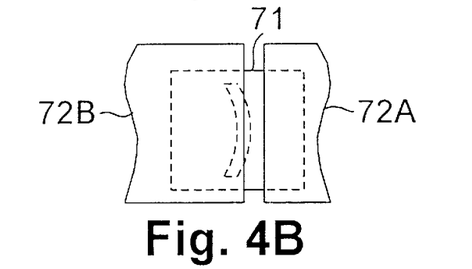

Said main controller MCU controls the movable blade-driving unit 73A, 73B. An example of a control system will be described below with reference to FIGS. 3 and 4. FIGS. 4A through 4E represent plan views showing the relative position between the opening of the fixed field stop 71 and the blades 72A, 72B of the movable field stop. FIGS. 4F through 4J represent plan views showing the position of the exposure area IE relative to the single shot area on the wafer 11. FIG. 4F shows the relative position between the exposure area IE and the shot area SA where the position of the movable field stop is shown in FIG. 4A. In the same way, FIG. 4G corresponds to FIG. 4B, FIG. 4H to FIG. 4C, FIG. 4I to FIG. 4D, and FIG. 4J to FIG. 4E. In FIGS. 4F through 4J showing the relative position between the shot area SA and exposure area IE, the hatched area shows where the radiation light actually illuminates on the wafer 11.

The main controller MCU shown in FIG. 3 drives the mask stage ST1 and the substrate stage ST2 by means of the drivers MT1, MT2, and places the exposure area IE at the left side of the shot area SA shown in FIG. 4F. At this time, since the blades 72A and 72B of the movable field stop are closed as shown in FIG. 4A, radiation light does not reach the exposure area IE (the exposure area IE is not formed).

The main controller MCU then drives the mask stage ST1 and the substrate stage ST2 along the sweeping direction with velocities determined by the magnification of the projection optical system by means of the driving units MT1 and MT2. At the same time, the main controller MCU drives the blade 72B along the sweeping direction by means of the movable blade-driving unit 73B. At this time, in order that the edge image of the blade 72B substantially coincides with the edge of the shot area SA, the blade 72B is driven in accordance with the stages ST1 and ST2.

Figure 4C:
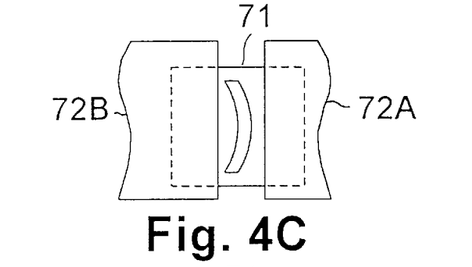
Figure 4D:
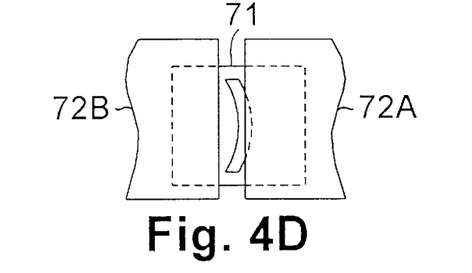
Figure 4E:
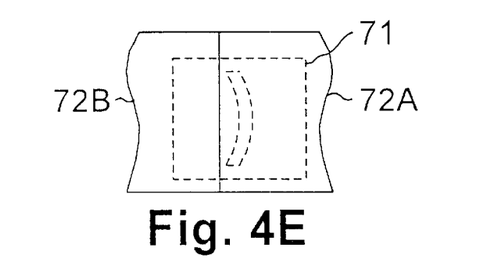
Figure 4F:
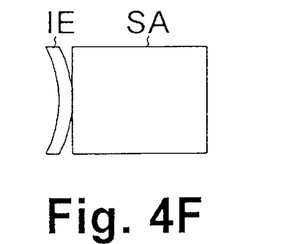
FIGS. 4F through 4J represent the plan view showing the relative position between the shot area and the exposure area on the wafer.
Figure 4G:
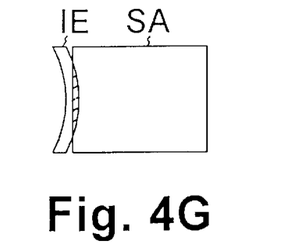
Figure 4H:
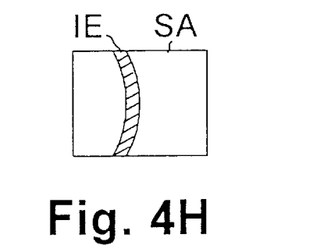
Figure 4I:
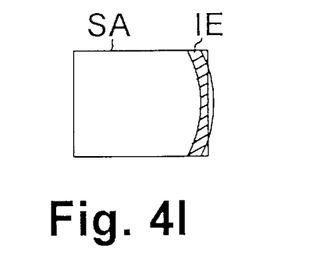

When the blades 72A and 72B are opened as shown in FIG. 4C, radiation light passes through the whole area of the opening of the fixed field stop 71. As a result, the exposure area IE corresponding to the image of the opening of the fixed field stop 71 is formed in the shot area SA on the wafer 11 as shown in FIG. 4H. In this instance, since the stages ST1 and ST2 are still being driven along the sweeping direction, the exposure area IE sweeps the shot area SA. When the exposure area IE approaches the edge of the shot area SA as shown in FIG. 4I, the main controller MCU drives the blade 72A along the sweeping direction by means of the movable blade driving unit 73A, as shown in FIG. 4D. Therefore, radiation light overflowing from the shot area SA, which is directed to the exposure area IE, is blocked by the blade 72A. At this time, the blade 72A is driven in order that the image of the edge of the blade 72A substantially coincides with the edge of the shot area SA in accordance with the stages ST1 and ST2.

Figure 4J:
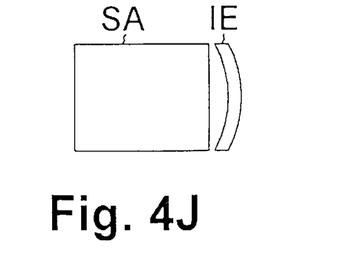

When the exposure area IE goes beyond the shot area SA as shown in FIG. 4J, the blades 72A and 72B are then closed, and radiation light is no longer directed to the exposure area IE (the exposure area IE is no longer formed).

From the series of movements described above, the pattern on the reflection mask 9 is projected in a single shot area on the wafer 11. The main controller MCU then drives the substrate stage ST2 by means of the driving unit MT2, and the exposure area IE is moved to another shot area (typically next to the former shot area SA). Then, the series of movements described above is repeated.

Although the pattern is projected in a single shot area with a one stroke scanning exposure movement as described in FIGS. 3 and 4, a so called "scan and stitch exposure" may be used so that the pattern is projected in a single shot with a multi stroke scanning exposure movement. When the scan and stitch exposure is used, since a wide exposure area (in scanning direction) is not required for the projection optical system 10, it becomes simple to manufacture the projection optical system, and it has the merit of improving the imaging quality of the projection optical system. Suzuki discloses this type of scan and stitch exposure apparatus in U.S. patent application Ser. No. 08/654,747 filed on May 29, 1996.

In the embodiment shown in FIG. 1, it is possible to use an illumination optical system disclosed in U.S. patent application Ser. No. 09/359,137 filed on Feb. 26, 1999 by Komatsuda, a coinventor of the present invention.

It should be briefly explained that U.S. patent application Ser. No. 09/359,137 is applied to the present invention. In the illumination optical system disclosed in patent application Ser. No. 09/359,137, radiation light provided from light source 54 is directed to a reflection type optical integrator, forms a second source having a predetermined shape, and illuminates mask M through a condenser optical system 64. It is possible to replace the optical system 4, 5, and 6 shown in FIG. 1 of the present invention with the illumination optical system (54, 56, and 64) of patent application Ser. No. 09/359,137, so that the illumination optical system (54, 56, and 64) is used for illuminating the field stop 7, and the image of the field stop 7 is projected to the reflection mask 9 by the relay optical system 8 shown in FIG. 1.

The illuminance distribution on the reflection mask 9 or on the wafer 11, may be varied by adjusting the position of at least one of the optical elements comprising the illumination optical system, or by inserting a reflecting element having a spatial distribution of reflectance into the illumination optical system. By means of varying the illuminance distribution on the reflection mask 9, or on the wafer 11 (exposed substrate as a work), it is possible to obtain a uniform (or other desired) illuminance distribution. In this case, it is desirable that the position of the optical element performing the adjustment be located in the optical path between the field stop 7 and the radiation source.

In the illumination optical system shown in FIG. 1, it is possible to change distortion (isotropic or anisotropic) in the optical elements illuminating the field stop 7 by such procedures as changing the inclination of at least one of the plane mirrors 5, by changing the position of the concave mirror 6 along or perpendicular to the optical axis, or by changing the slight inclination of the concave mirror 6. As a result, the illuminance distribution on the field stop 7, on the reflection mask 9, or on the wafer 11, may be varied.

It is likely that while moving one of the said optical elements, optical properties other than distortion (e.g., telecentricity) will change. In this case, moving the position of at least one other optical element may produce an adjustment.

At this point, it is not desirable that an optical element between the field stop 7 and the reflection mask 9, which is an optical element consisting of the relay optical system 8, be moved to adjust the position. The reason is that it not only changes the luminance distribution of the radiation light but also changes the shape of the opening of the field stop 7. On the other hand, there is no limitation of position where a reflecting element having a spatial distribution of reflectance is inserted.

In the embodiment described above, an arc shaped illumination area is formed on the reflection mask 9. However, the present invention is not limited to the arc shape. If the projection optical system is made for forming a rectangular shaped exposure area, the illumination optical system according to the present invention may easily be modified to illuminate the rectangular shaped area. This is accomplished by modifying the shape of the opening of the field stop from an arc shape to a rectangular shape.

As for the projection optical system, a system having unit magnification and expansion magnification as well as reduction magnification may be used. The present invention may also be applied to a proximity type scanning exposure apparatus, such as an x-ray exposure apparatus where a mask and a wafer are moved in a body relative to the arc shaped illumination area illuminated with x-ray radiation.

The present invention may be applied not only to a projection exposure apparatus for manufacturing semiconductor devices but also to a projection exposure apparatus for manufacturing display devices, including liquid crystal displays, by projecting device patterns onto a glass plate. It may also be applied to projection exposure apparatuses for manufacturing thin film magnetic heads by projecting a device pattern onto a ceramic wafer, for manufacturing image detectors (such as CCDs), or for manufacturing a reticle or mask by projecting a device pattern onto a glass substrate or silicon wafer.

The foregoing description of the embodiment has been presented for the purpose of clarifying the technical content of the present invention. It is not intended to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated.

We claim:

1. A projection exposure apparatus comprising:
   a light source providing radiation light;
   an illumination optical system directing said radiation light to a reflection mask on which a predetermined pattern is formed;
   a projection optical system directing said radiation light reflected by said reflection mask to a work for forming an image of a predetermined pattern on said work; and
   a scanning driver relatively moving at least one of said reflection mask and said work;
   wherein said illumination optical system includes a field stop located close by a position conjugate with said reflection mask.

2. A projection exposure apparatus according to claim 1, wherein said illumination optical system includes a relay optical system to make said field stop substantially conjugate with said reflection mask.

3. A projection exposure apparatus according to claim 2, wherein said relay optical system is a catoptric system.

4. A projection exposure apparatus according to claim 1, wherein said light source provides radiation light having wavelength shorter than 50 nm.

5. A projection exposure apparatus according to claim 1, further comprising at least one optical element located between said light source and said field stop, wherein a position of at least one optical element is adjustable in order to change illuminance distribution on said reflection mask or on said exposed substrate.

6. A projection exposure apparatus, for directing radiation light to a reflection mask on which a predetermined pattern is formed, and for projecting an image of said predetermined pattern on a work by said radiation light reflected by said reflection mask, the projection exposure apparatus comprising:
   a radiation light source;
   an illumination optical system located in an optical path between said radiation light source and said reflection mask, and directing said radiation light provided from said radiation light source to said reflection mask;
   a projection optical system located in an optical path between said reflection mask and said work, directing said radiation light reflected by said reflection mask to the work, and forming the image of said predetermined pattern on said work;
   a scanning driver relatively changing positional relationship between at least one of said reflection mask and said work, and said projection optical system; and
   a field stop located close by a position conjugate with said reflection mask.

7. A projection exposure apparatus according to claim 6, wherein said field stop is located in said illumination optical system.

8. A projection exposure apparatus according to claim 7, wherein said illumination optical system includes a relay optical system, located in an optical path between said field stop and said reflection mask, projecting an image of said field stop on said reflection mask.

9. A projection exposure apparatus according to claim 6, wherein said radiation light source provides radiation light having wavelength below 50 nm.

10. An illumination apparatus, for using in a photolithography apparatus forming an image of a reflection mask, on which a predetermined pattern is formed, on a work, the illumination apparatus comprising:
    a radiation light source; and
    an illumination optical system located in an optical path between said radiation light source and said reflection mask, and for directing said radiation light provided from said radiation light source to a predetermined illumination area on said reflection mask;
    wherein said illumination optical system includes a field stop and a relay optical system forming an image of said field stop on said reflection mask as said predetermined illumination area.

11. An illumination apparatus according to claim 10, wherein said radiation light source provides radiation light having wavelength shorter than 50 nm.

12. An illumination apparatus according to claim 10, wherein said relay optical system is a catoptric system.

13. A method of projecting and exposing a predetermined pattern formed on a reflection mask onto a work, comprising the steps of:
    providing a radiation light source;
    illuminating the reflection mask on which the predetermined pattern is formed with said radiation light by means of an illumination optical system;
    projecting said pattern of said reflection mask onto said work by reflected light from said reflection mask; and
    relatively moving at least one of said reflection mask and said work; wherein said illuminating step further comprising a step of forming an image of a field stop positioned within said illumination optical system on said reflection mask.

14. A method according to claim 13, wherein said radiation light having wavelength shorter than 50 nm.

15. A method according to claim 14, further comprising a step of adjusting illuminance distribution on said reflection mask or on said work by changing a position of at least one optical element located along an optical path of said radiation light directed to said field stop.

16. A projection exposure apparatus, for directing radiation light to a reflection mask on which a predetermined pattern is formed, and for projecting an image of said predetermined pattern on a work by said radiation light reflected by said reflection mask, the projection exposure apparatus comprising:

a radiation light source;

an illumination optical system located in an optical path between said radiation light source and said reflection mask, and directing said radiation light provided from said radiation light source to said reflection mask; and a projection optical system located in an optical path between said reflection mask and said work, directing said radiation light reflected by said reflection mask to said work, and forming the image of said predetermined pattern on said work;

wherein a position of at least one of reflection optical elements located along the optical path of said radiation light in said illumination optical system is adjustable in order to adjust illuminance distribution of said radiation light on said work, and said illumination optical system includes a field stop disposed near a plane conjugate with said reflection mask.

17. A projection exposure apparatus according to claim 16, wherein said radiation light source provides radiation light having wavelength shorter than 50 nm.

18. A method of projecting and exposing a predetermined pattern formed on a reflection mask onto a work, comprising the steps of:

providing a radiation light source;

illuminating the reflection mask on which the predetermined pattern is formed with said radiation light by means of an illumination optical system having a field stop disposed near a plane conjugate with said reflection mask and optical elements positioned along an optical path of said radiation light directed to said field stop;

projecting said pattern of said reflection mask onto an exposure area of said work by reflected light from said reflection mask;

adjusting a position of at least one of said optical elements in order to change illuminance distribution on said exposure area of said work.

19. A method according to claim 18, wherein said radiation light source provides light with wavelength shorter than 50 nm.

20. A projection exposure apparatus for projecting an image of a predetermined pattern formed on a reflection mask on a work, the projection exposure apparatus comprising:

a radiation light source;

an illumination optical system located in an optical path between said radiation light source and said reflection mask for directing radiation light from said radiation light source to said reflection mask, having at least one reflection optical element located along an optical path of said radiation light; and a projection optical system located in an optical path between said reflection mask and said work for directing light reflected by said reflection mask to the work and forming the image of said predetermined pattern on said work;

wherein a position of at least one of said reflection optical element is adjustable in order to adjust distortion of said illumination optical system and illuminance distribution of said radiation light on said work.

21. A projection exposure apparatus according to claim 20, wherein said radiation light source provides radiation light having wavelength shorter than 50 nm.

22. A method of projecting and exposing a predetermined pattern formed on a reflection mask onto a work, comprising the steps of:

providing a radiation light source;

illuminating the reflection mask on which the predetermined pattern is formed with radiation light from said radiation light source by means of an illumination optical system having a field stop and optical elements positioned along an optical path of said radiation light directed to said field stop;

projecting said pattern of said reflection mask onto an exposure area of said work by reflected light from said reflection mask; and adjusting position of at least one of said optical elements in order to change distortion of said illumination optical system and illuminance distribution on said exposure area of said work.

23. A method according to claim 22, wherein said radiation light source provides light with wavelength shorter than 50 nm.

24. A projection exposure apparatus for projecting an image of a predetermined pattern formed on a reflection mask on a work, the projection exposure apparatus comprising:

a radiation light source;

an illumination optical system located in an optical path between said radiation light source and said reflection mask for directing radiation light from said radiation light source to said reflection mask; and a projection optical system located in an optical path between said reflection mask and said work for directing light reflected by said reflection mask to the work and forming the image of said predetermined pattern on said work;

wherein said illumination optical system includes a field stop arranged near a plane conjugate with said reflection mask, and the field stop includes a movable blade.

25. A projection exposure apparatus according to claim 24, wherein said field stop includes a plurality of movable blades.

26. A projection exposure apparatus according to claim 24, further comprising a scanning driver relatively moving at least one of said reflection mask and said work, wherein said field stop adjusts a width in scanning direction.

27. A projection exposure apparatus according to claim 26, wherein said radiation light source provides radiation light with wavelength shorter than 50 nm.

28. A projection exposure apparatus, for directing radiation light to a reflection mask on which a predetermined pattern is formed, and for projecting an image of said predetermined pattern on a work by radiation light reflected by said reflection mask, the projection exposure apparatus comprising:

a radiation light source;

an illumination optical system, located in an optical path between said radiation light source and said reflection mask, for directing said radiation light provided from said radiation light source to said reflection mask;

a projection optical system, located in an optical path between said reflection mask and said work, for directing said radiation light reflected by said reflection mask to the work, and for forming the image of said predetermined pattern on said work;

a mask stage for holding said reflection mask;

a work stage for holding said work;

a scanning driver, connected to at least one of said mask stage and said work stage, for relatively changing positional relationship between at least one of said reflection mask and said work, and said projection optical system along a sweeping direction; and a movable blade, located in an optical path between said radiation light source and said reflection mask, which is movable along a direction corresponding to said sweeping direction.

29. A projection exposure apparatus according to claim 28, wherein said movable blade defines a width in the sweeping direction of an exposure area on said work.

30. A projection exposure apparatus according to claim 29, wherein movement of said movable blade is synchronized with movement of at least one of said mask stage and said work stage.

31. A projection exposure apparatus according to claim 28, wherein said radiation light source provides radiation light with wavelength shorter than 50 nm.

32. A method for projecting an image of a predetermined pattern formed on a reflection mask on a work with a projection optical system, the method comprising the steps of:

providing radiation light;

directing said radiation light to said reflection mask;

directing said radiation light reflected by said reflection mask to the work;

forming the image of said predetermined pattern on said work;

changing positional relationship between at least one of said reflection mask and said work, and said projection optical system along a sweeping direction; and moving a movable blade along a direction corresponding to said sweeping direction.

33. A method according to claim 32, wherein said movable blade defines a width in the sweeping direction of an exposure area on said work.

34. A method according to claim 33, wherein movement of said movable blade is synchronized with movement of at least one of said mask and said work.

35. A method according to claim 32, wherein said radiation light has wavelength shorter than 50 nm.

* * * * *